United States Patent [19]
Yoneda

[11] Patent Number: 6,141,366
[45] Date of Patent: Oct. 31, 2000

[54] PITCH-CONVERTING SUBSTRATE USED IN SEMICONDUCTOR LASERMODULE AND SEMICONDUCTOR LASERMODULE

[75] Inventor: Isao Yoneda, Tokyo, Japan

[73] Assignee: NEC Corporation, Tokyo, Japan

[21] Appl. No.: 09/174,308

[22] Filed: Oct. 19, 1998

[30] Foreign Application Priority Data

Oct. 17, 1997 [JP] Japan .................................. 9-285682

[51] Int. Cl.[7] .............................. H01S 5/00; G02B 6/30; G02B 6/36
[52] U.S. Cl. ................................ 372/50; 385/49; 385/89; 385/88
[58] Field of Search .......................... 372/43, 50; 385/49, 385/89, 88, 122, 92

[56] References Cited

U.S. PATENT DOCUMENTS 5,432,877  7/1995  Sun et al. ................................... 385/33

FOREIGN PATENT DOCUMENTS

| 63-098611 | 4/1988 | Japan . |
| 2-135306 | 5/1990 | Japan . |
| 6-102437 | 4/1994 | Japan . |
| 8-274354 | 10/1996 | Japan . |
| 8-292345 | 11/1996 | Japan . |

OTHER PUBLICATIONS

J.M. Cheong et al., "High alignment tolerance coupling scheme for multichannel laser diode/singlemode fibre modules using a tapered waveguide array", p. 1515, Electronics Letters, vol. 30, No. 18, Sep. 1, 1994.

*Primary Examiner*—Teresa M. Arroyo
*Assistant Examiner*—Q. P. Leung
*Attorney, Agent, or Firm*—Young & Thompson

[57] ABSTRACT

It is an object of the invention to effectively use semiconductor laser elements by suppressing difficulties caused by heat generated at the times of mounting and light emission in the semiconductor laser elements. A semiconductor laser module comprises a light source-mounting section, on which plural semiconductor laser elements are mounted and optical fiber-fixing section, which upports plural optical fibers at a predetermined lateral pitch. A pitch-converting section is provided between the light source-mounting section and the optical fiber-fixing section in order to respectively guide lights semitted from the semiconductor laser elements to the corresponding optical fibers. The light source-mounting section, the pitch-converting section and the optical fiber fixing section are formed on the same substrate.

8 Claims, 2 Drawing Sheets

PITCH-CONVERTING SUBSTRATE USED IN SEMICONDUCTOR LASERMODULE AND SEMICONDUCTOR LASERMODULE

FIELD OF THE INVENTION

The invention relates to a semiconductor laser module of an array type used in an optical communication system, and especially to a semiconductor laser module, in which a lateral pitch of semiconductor laser elements is different from that of optical fibers, and a pitch-converting substrate used in the semiconductor laser module.

BACKGROUND OF THE INVENTION

In a conventional semiconductor module of an array type, plural optical fibers for propagating optical signals are arranged in parallel with each other at a certain lateral pitch, and a semiconductor laser for supplying the optical fibers with the optical signals is used as a light source. The semiconductor laser is composed of plural semiconductor laser elements of the same number as that of the optical fibers. The semiconductor laser elements are arranged at the same lateral pitch as that of the optical fibers, and unified to form a single chip, which is mounted on a substrate.

However, on the aforementioned semiconductor laser, following disadvantages have been pointed out, because this device is fabricated by unifying the plural semiconductor laser elements to form a single chip and mounted on the substrate. First, thermal stress at the time of mounting is high. Second, heat radiation characteristic of the semiconductor element is low, and the effect of thermal interference between channels (the semiconductor laser elements) is noticeable. Third, the yield rate of the unified chip is poor.

When the yield rate of the unified chip is taken into consideration, even in case that the one of the semiconductor laser element is a failure and the remaining ones normally operate, the chip is regarded as a failure also, and the other normal semiconductor laser elements are in vain. The aforementioned uselessness becomes noticeable as the number of the channels increases. Accordingly, it seems to be advantageous to mount the individual semiconductor laser elements in conformity with the lateral pitch of the optical fibers, without using the chip, which is obtained by unifying the plural semiconductor laser elements, in order to avoid the aforementioned uselessness in the normal semiconductor laser elements. However, the lateral pitch of the optical fibers is minute, and it is extremely difficult to mount the semiconductor laser elements on the substrate at the same pitch as that of the optical fibers.

SUMMARY OF THE INVENTION

Accordingly, it is an object of the invention to provide a pitch-converting substrate for a semiconductor laser module of an array type, which solves problems of heat generated at the times of mounting and light emission and effectively uses semiconductor laser elements.

It is a further object of the invention to provide a semiconductor laser module of an array type, which solves problems of heat generated at the times of mounting and light emission and effectively use semiconductor laser elements.

According to the first feature of the invention, a pitch converting substrate comprises:

a light source-mounting section provided with plural semiconductor laser elements, which are mounted thereon and arranged in parallel with each other at a first predetermined lateral pitch, an optical fiber-fixing section for supporting plural optical fibers running in parallel with each other at a second predetermined lateral pitch, a number of the plural optical fibers corresponds to that of the plural semiconductor laser elements, and a pitch-converting section, which lies between the light source-mounting section and the optical fiber-fixing section and is provided with plural waveguids for respectively and optically coupling the plural semiconductor laser elements with the corresponding optical fibers, wherein the first predetermined lateral pitch is larger than the second predetermined lateral pitch and said plural waveguides are arranged with said first predetermined lateral pitch on a side of said light source-mounting section, and with said second predetermined lateral pitch on a side of said optical fiber-fixing section.

According to the second feature of the invention, a semiconductor laser module of an array type comprises:

plural semiconductor laser elements which are mounted on a light source-mounting section and arranged in parallel with each other at a first predetermined lateral pitch, plural optical fibers extending from an array optical fiber and running in parallel with each other at a second predetermined lateral pitch, a number of the plural optical fibers that of the plural semiconductor laser elements, an optical fiber-fixing section for supporting the plural optical fibers at the second predetermined lateral pitch, and plural for respectively and optically coupling the plural semiconductor laser elements with the corresponding optical fibers and mounted on a pitch converting section, wherein the first predetermined lateral pitch is larger than the second predetermined lateral pitch and said plural waveguides are arranged with said first predetermined lateral pitch on a side of said plural waveguides, and with said second predetermined lateral pitch on a side of said plural optical fibers.

BRIEF DESCRIPTION OF THE DRAWINGS

The invention will be explained in more derail in conjunction with appended drawings, wherein.

DESCRIPTION OF THE PREFERRED EMBODIMENT

Next, a preferred embodiment of the invention will be explained referring to the appended drawings.

Figure 1:
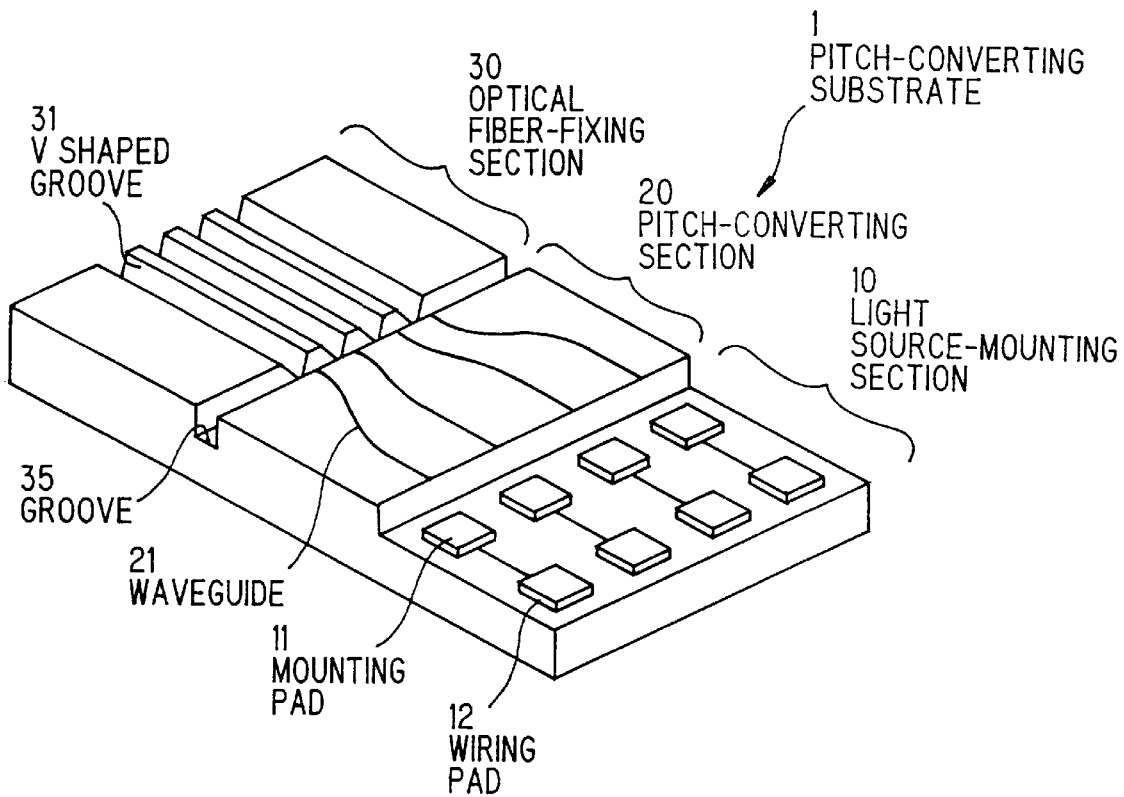
FIG. 1 shows a perspective view for showing a pitch-converting substrate as the first preferred embodiment of the invention.

FIG. 1 shows a perspective view of a pitch-converting substrate as a preferred embodiment of the invention. The pitch-converting substrate 1 is used for optically coupling semiconductor laser elements, which serve as light sources, with optical fibers in a semiconductor laser module of an array type. As shown in FIG. 1, a pitch-converting section 20, which is provided with plural optical waveguides 12, is located on the central region of the pitch-converting substrate 1. Moreover, an optical fiber-fixing section 30, to which the optical fibers 52 of the later mentioned array optical fiber 51 (FIG. 3) are fixed, is positioned near the left end of the pitch-converting substrate 1, and a light source-mounting section 10, on which later mentioned semiconductor laser elements 53 (FIG. 3) are mounted, is positioned near the right end of the same. The aforementioned optical fiber-fixing section 30, the pitch-converting section 20 and the light source-mounting section 10 are formed on the same pitch-converting substrate 1, the length, the width and the height of which are respectively 10 mm, 4 mm and 0.45 mm.

The optical waveguides 21 are arranged nearly in parallel with each other, and so formed that a lateral pitch therebetween at an input end is lager than that at an output end. The lateral pitch of the optical waveguides 21 at the output end is equal to that of the array optical fibers 52 extending from the array optical fiber 51, which are connected with the pitch-converting substrate 1. Since the lateral pitch of the optical fibers 52 in the ordinary array optical fiber 51 is 250 μm, the lateral pitch of the optical waveguides 21 at the output end is selected to be 250 μm, and that at the input end 500 μm in this embodiment.

As the optical waveguide 21, a waveguide of $SiO_2$ series can be exemplified as a typical one. The structure of the waveguide of $S_iO_2$ series will be explained referring to the cross-sectional view shown in FIG. 2. An under clad layer 26 constituted of PSG (P doped $S_iO_2$ glass) is formed on a base 25 constituted Si or $I_nP$, and cores 27 constituted of GPSG, which is obtained by adding Ge to PSG, are patterned thereon in the shapes of the waveguides 21. Moreover, on the under clad layer 26 comprising the cores 27 formed thereon, an upper clad 28 with the same composition as that of the under clad layer 26 is formed, and the cores 27 are covered therewith. Optical signals propagate through the cores 27.

As shown in FIG. 1, a square shaped groove 35, which passes across the pitch-converting substrate 1 in the transverse direction, is formed between the pitch-converting section 20 and the optical fiber-fixing section 30, and the height of the pitch-converting substrate 1 at the light source-mounting section is lower than that at the pitch-converting section 20. Accordingly, the cores 27 are exposed at both the input and output ends of the waveguides 21.

Figure 2:
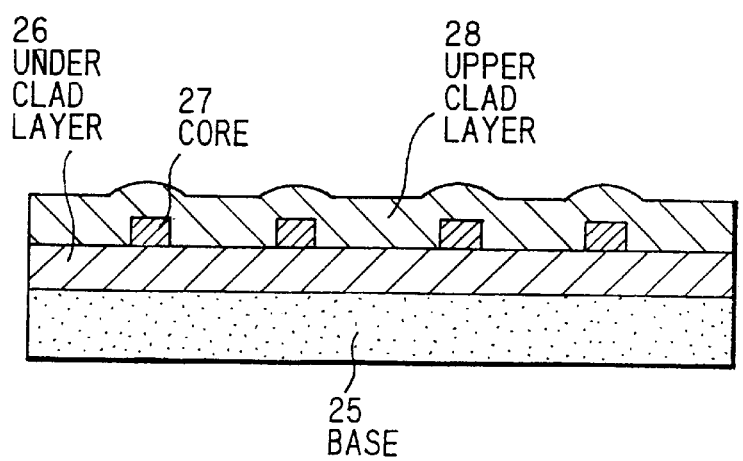
FIG. 2 shows a cross-sectional view of a pitch-converting section of the pitch-converting substrate shown in FIG.1.
Figure 3:
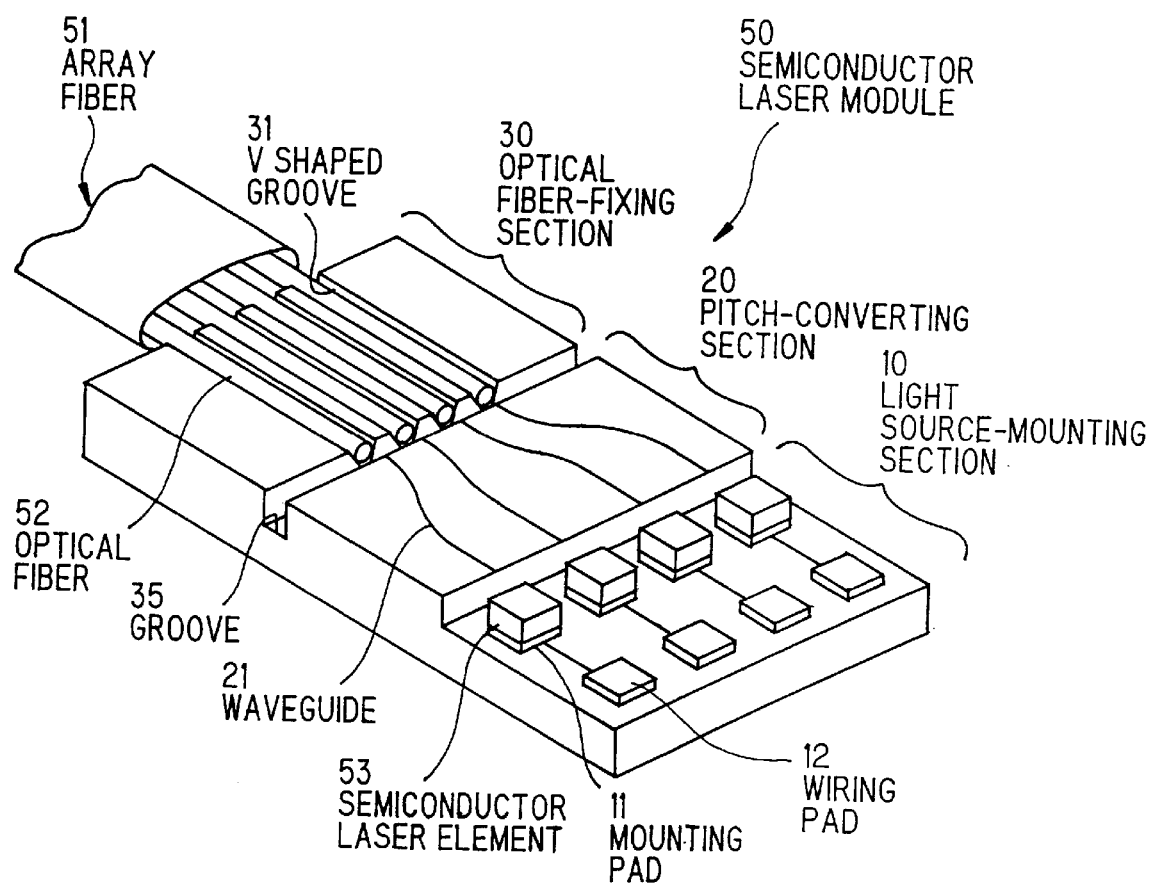
FIG. 3 shows a perspective view for showing a semiconductor laser module as the second preferred embodiment of the invention.

The optical fiber-fixing section 30 is provided with plural V shaped grooves 31, which extend from a side wall of the square shaped groove 35 to a left end of the pitch-converting substrate 1 and fix the positions of the optical fibers 52 (FIG. 3). The number of the V shaped grooves 31 is the same as that of the waveguides 21, and each V shaped groove is so formed that it opposes to the corresponding waveguide 21. The depth of the V shaped groove is so designed that the optical axis of the optical fiber 52 is aligned with that of the core 27 of the waveguide 21, when the optical fiber 52 is supported by the V shaped groove 31 (FIG. 2).

On the other hand, plural mounting pads 11 for respectively mounting the semiconductor laser elements 53 thereon are formed on the light source-mounting section 10 (FIG. 3). The number of the mounting pads 11 is the same as that of the waveguides 21. The respective mounting pads 11 are located on the positions corresponding to the waveguides 21 at the same lateral pitch as that of the waveguides 21 at the input end. The height of the core 27 of the waveguide 21 above the mounting pad 11 is so designed that a laser light emitted from the semiconductor laser element 53 launches the core 27, when the semiconductor laser element 53 is mounted on the mounting pad 11.

Moreover, the light source-mounting section 10 is provided with plural wiring pads 12, which are electrically connected with the mounding pads 11. Each of the wiring pads 12 is electrically connected with a driving source (not shown) for driving the semiconductor laser element 53 mounted on the mounting pad 11.

In the pitch-converting substrate 1 constructed in the aforementioned way, the semiconductor laser elements 53 are respectively mounted on the mounting pads 11 on the light source-mounting section 10, and the array optical fiber 51 is fixed by the optical fiber-fixing section 30, and a semiconductor laser module 50 can be constructed in this way as shown in FIG. 3. The array optical fiber 51 are composed of the plural optical fibers 52 supported at a predetermined lateral pitch, and each of the optical fibers 52 is positioned and fixed by the V shaped grove 31. Accordingly, the optical axis of each optical fiber 52 can be easily aligned with that of a corresponding waveguide 21, and when a laser light is emitted from the semiconductor laser element 53, the light launches the corresponding optical fiber 52 after passing through the waveguide 21 of the pitch-converting section 20.

The semiconductor laser element 53 is mounted on the mounting pad 11 by means of passive alignment mounting. The optical fiber 52 is fixed to the V shaped groove 31 by means of adhesive. In case that the optical fiber 52 is fixed to the V shaped groove 31 by means of adhesive, since the optical fiber-fixing section 30 and the pitch-converting section 20 are separated from each other by the groove 35, even if adhesive overflows the V shaped groove 31, flood-adhesive is collected in the groove 35, and never stick to the end surface of the optical fiber 52 and the output end of the waveguide 21. As the result, the optical signal transmission between the waveguide and the optical fiber is not disturbed by adhesive.

As mentioned in the above, since the light emitted from the semiconductor laser element 53 is guided to the optical fiber 52 via the waveguide 21, the lateral pitch of the semiconductor laser elements 53 serving as light sources can be selected at will independently of the lateral pitch of the optical fibers 52 in the array optical fiber 51. As the result, the lateral pitch of the semiconductor laser elements 53 can be increased, so that the plural semiconductor laser elements 53 can be mounted on the semiconductor laser module 50 leaving a space therebetween and one by one.

As mentioned in the above, since the semiconductor laser elements 53 can be mounted on the substrate one by one, heat applied to the substrate at the time of mounting can be decreased as compared with the conventional technique, and the effect of the thermal stress is kept to be low. Moreover, since the semiconductor laser elements can be mounted leaving a space therebetween, radiation of heat generated at the time of light emission can be improved.

Furthermore, since the semiconductor laser elements 53 can be mounted one by one, failure in one of the semiconductor laser elements 53 does not affect the other semiconductor laser elements 53. That is to say, in case that failure occurs in some of the semiconductor laser elements 53, the remaining ones can be used keeping them intact by replacing the semiconductor laser elements in failure, hence uselessness in the semiconductor laser elements can be avoided.

As mentioned in the above, according to the invention, since the semiconductor laser elements optically couple with the optical fibers via the waveguides, the arrangement of the semiconductor laser elements can be determined at will independently of the lateral pitch of the optical fibers. As the result, the semiconductor laser elements can be mounted on a substrate leaving a distance therebetween, and radiation of heat generated in the semiconductor laser element at the time of light emission can be improved. Moreover, the semiconductor laser elements can be mounted on the substrate one by one, the effect of thermal stress at the time of mounting of the semiconductor laser element can be kept to below. Furthermore, even in case that failure occurs in one of the semiconductor laser elements, the other ones can be still used keeping them intact by coping with the semiconductor laser element in failure.

Particularly, the alignmen of the optical axes of the waveguids and the optical fibers can be easily carried out by providing the plural V shaped grooves having the same lateral pitch as that of the optical fibers. Moreover, in case that the optical fibers are fixed to the V shaped groove by means of adhesive, the situation that adhesive sticks to the end surfaces of the waveguides and the optical fibers can be avoided by forming a groove, which separates the optical fiber-fixing section and the pitch-converting section from each other.

Although the invention has been described with respect to specific embodiment for complete and clear disclosure, the appended claims are not to be thus limited but are to be construed as embodying all modification and alternative constructions that may be occurred to one skilled in the art which fairly fall within basic teaching here is set forth.

What is claimed is:

1. A pitch converting substrate used in a semiconductor laser module comprising:
    a light source-mounting section provided with plural semiconductor laser elements, which are mounted thereon and arranged in parallel with each other at a first predetermined lateral pitch,
    an optical fiber-fixing section for supporting plural optical fibers running in parallel with each other at a second predetermined lateral pitch, a number of said plural optical fibers corresponding to that of said plural semiconductor laser elements, and
    a pitch-converting section, which lies between said light source-mounting section and said optical fiber-fixing section and is provided with plural waveguides for respectively and optically coupling said plural semiconductor laser elements with said corresponding optical fibers,
    wherein said first predetermined lateral pitch is larger than said second predetermined lateral pitch, and said plural waveguides are arranged with said first predetermined lateral pitch on a side of said light source-mounting section, and with said second predetermined lateral pitch on a side of said optical fiber-fixing section.

2. The pitch converting substrate as defined in claim 1, wherein:
    said light source-mounting section, said optical fiber-fixing section and said pitch-converting section are mounted on a common substrate.

3. The pitch-converting substrate as defined in claim 1, wherein:
    said optical fiber-fixing section is provided with plural V shaped grooves, to which each of said plural optical fibers is fixed.

4. The pitch-converting substrate as defied in claim 3, wherein:
    said pitch-converting section and said optical fiber-fixing section are separated from each other by a groove formed therebetween, and said plural optical fibers are respectively stuck to said plural V shaped groove by adhesive.

5. A semiconductor laser module, comprising:
    plural semiconductor laser elements which are mounted on a light source mounting section and arranged in parallel with each other at a first predetermined lateral pitch,
    plural optical fibers extending from an optical fiber array and running in parallel with each other at a second predetermined lateral pitch, a number of said plural optical fibers corresponding to that of said plural semiconductor laser elements,
    an optical fiber-fixing section for supporting said plural optical fibers at said second predetermined lateral pitch, and plural waveguides for respectively and optically coupling said plural semiconductor laser elements with said corresponding optical fibers and mounted on a pitch converting section,
    wherein said first predetermined lateral pitch is larger than said second predetermined lateral pitch, and said plural waveguides are arranged with said first predetermined lateral pitch on a side of said plural waveguides, and with said second predetermined lateral pitch on a side of said plural optical fibers.

6. A semiconductor laser module according to claim 5, wherein:
    said light source-mounting section, said optical fiber-fixing section and said pitch-converting section are mounted on a same substrate.

7. A semiconductor laser module according to claim 5, wherein:
    said optical fiber-fixing section is provided with plural V shaped grooves, to which each of said plural optical fibers is fixed.

8. A semiconductor laser module according to claim 7, wherein:
    said pitch-converting section and said optical fiber-fixing section are separated from each other by a groove formed therebetween, and said plural optical fibers are respectively stuck to said plural V shaped groove by adhesive.

* * * * *